United States Patent
Tuan

(10) Patent No.: US 8,411,527 B1
(45) Date of Patent: Apr. 2, 2013

(54) MULTIPLE SLEEP MODE MEMORY DEVICE

(75) Inventor: Tim Tuan, San Jose, CA (US)

(73) Assignee: Xilix, Inc., San Jose, CA (US)

( * ) Notice: Subject to any disclaimer, the term of this patent is extended or adjusted under 35 U.S.C. 154(b) by 179 days.

(21) Appl. No.: 13/092,040

(22) Filed: Apr. 21, 2011

(51) Int. Cl.
*G11C 7/00* (2006.01)

(52) U.S. Cl. .................... 365/229; 365/226; 365/72

(58) Field of Classification Search .................. 365/229, 365/226, 72, 63, 154
See application file for complete search history.

(56) References Cited

U.S. PATENT DOCUMENTS 7,149,142 B1 * 12/2006 Fisher et al. .................. 365/229

* cited by examiner

*Primary Examiner* — David Lam
(74) *Attorney, Agent, or Firm* — W. Eric Webostad

(57) ABSTRACT

In a memory device, an array of memory cells is coupled between a virtual ground node and a supply node. First and second transistors are coupled in source-drain parallel between the virtual ground node and a ground bus. The first transistor is substantially larger than the second transistor. A control circuit provides a first gate signal to a gate of the first transistor and a second gate signal to a gate of the second transistor. The control circuit includes: a configuration memory cell providing a first control signal; an interconnect providing a second control signal; and control logic receiving the first and second control signals and providing the first gate signal. The array of memory cells has three modes responsive to the first and second gate signals, where the three modes include an active mode, a first sleep mode, and a second sleep mode.

20 Claims, 7 Drawing Sheets

MULTIPLE SLEEP MODE MEMORY DEVICE

FIELD OF THE INVENTION

An embodiment of the invention relates to integrated circuit devices ("ICs"). More particularly, an embodiment of the invention relates to a multiple sleep mode memory device for an IC.

BACKGROUND

Integrated circuits have become more "dense" over time, i.e., more logic and memory features have been implemented in an IC of a given size. Therefore, power consumption has become an increasingly more significant issue. Hence, it is desirable to provide an IC having reduced power consumption.

SUMMARY

One or more embodiments generally relate to a multiple sleep mode memory device.

An embodiment relates generally to a memory device. In such an embodiment, an array of memory cells is coupled between a virtual ground node and a supply node. A first transistor and a second transistor are coupled in source-drain parallel to one another between the virtual ground node and a ground bus. The first transistor is substantially larger than the second transistor. A control circuit provides a first gate signal to a gate of the first transistor and a second gate signal to a gate of the second transistor. The control circuit includes: a configuration memory cell coupled to provide a first control signal; an interconnect coupled to provide a second control signal; and control logic coupled to receive the first control signal and the second control signal, and further coupled to provide the first gate signal. The array of memory cells has three modes responsive to the first gate signal and the second gate signal, where the three modes include an active mode, a first sleep mode, and a second sleep mode.

Another embodiment relates generally to another memory device. In such an embodiment, an array of memory cells is coupled between a virtual ground node and a supply node. A first transistor and a second transistor are coupled in source-drain parallel to one another between the virtual ground node and a ground bus. The first transistor is substantially larger than the second transistor. A control circuit provides a first gate signal to a gate of the first transistor and a second gate signal to a gate of the second transistor. The control circuit includes: a first configuration memory cell coupled to provide a first control signal; an interconnect coupled to provide a second control signal; first control logic coupled to receive the first control signal and the second control signal, and further coupled to provide the first gate signal; a second configuration memory cell coupled to provide a third control signal; a non-volatile memory cell coupled to provide a fourth control signal; and second control logic coupled to receive the third control signal and the fourth control signal, and further coupled to provide the second gate signal. The array of memory cells has three modes responsive to the first gate signal and the second gate signal, where the three modes include an active mode, a first sleep mode, and a second sleep mode.

Yet another embodiment relates generally to an integrated circuit. Such an integrated circuit includes an array of memory cells, first and second transistors, and a control circuit. The first transistor and the second transistor are coupled in source-drain parallel to one another between the array of memory cells and a ground. The first transistor is substantially larger than the second transistor. The control circuit has a first output coupled to a gate of the first transistor and a second output coupled to a gate of the second transistor. The control circuit includes a configuration memory cell, an interconnect, and control logic. The output of the configuration memory cell is coupled to the gate of the second transistor. The control logic has a first input coupled to the output of the configuration memory cell, a second input coupled to the output of the interconnect, and an output coupled to the first output of the control circuit.

BRIEF DESCRIPTION OF THE DRAWINGS

Accompanying drawings show exemplary embodiments in accordance with one or more aspects of the invention. However, the accompanying drawings should not be taken to limit the invention to the embodiments shown, but are for explanation and understanding only.

DETAILED DESCRIPTION

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

One type of embedded memory is embedded static random access memory ("SRAM"). However, power consumption of embedded SRAM is a factor in lower power consuming designs of ICs. The following description is in terms of a field programmable gate array ("FPGA") for purposes of clarity by way of example not limitation. Accordingly, it should be understood that the following description is applicable to any IC having embedded RAM in accordance with the following description.

Figure 1:
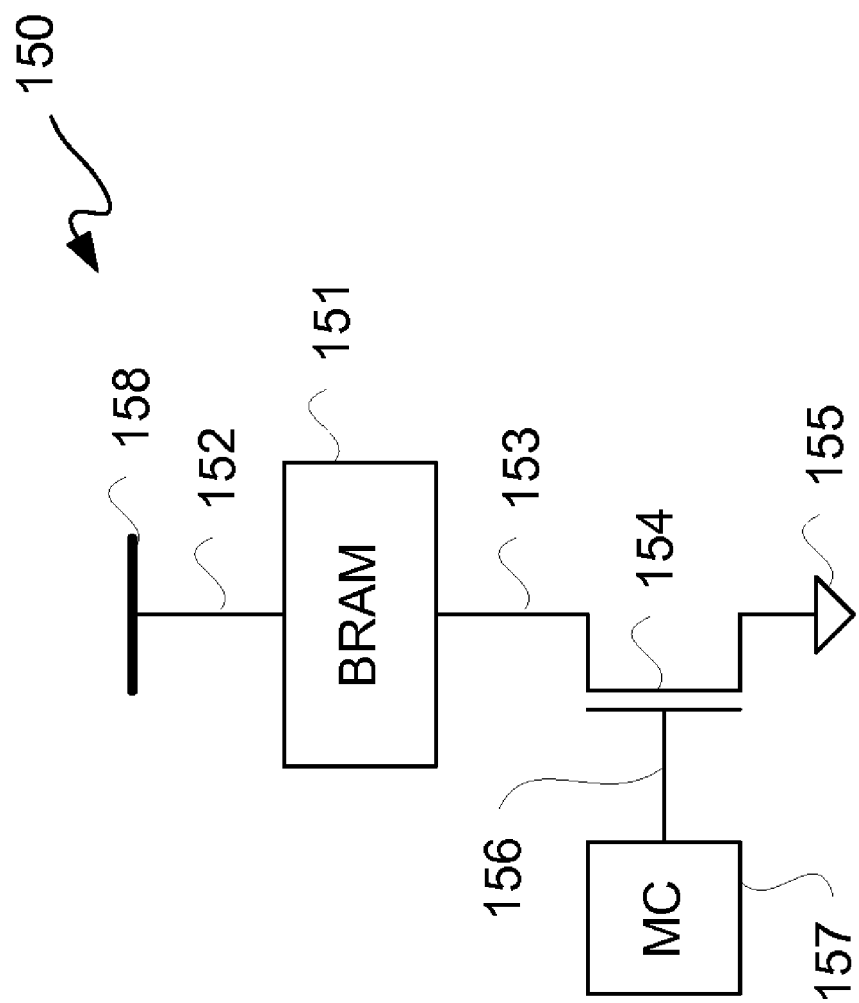
FIG. 1 is a block/circuit diagram depicting an exemplary embodiment of a memory device developed by others.

FIG. 1 is a block/circuit diagram depicting an exemplary embodiment of a memory device 150 developed by others. Memory device 150 includes an array of memory cells 151 with power gating transistor 154 coupled to a configuration memory cell 157. Array of memory cells 151 may be an array of static random access memory cells, such as an array of SRAM cells in a block RAM ("BRAM"). For purposes of clarity by way of example not limitation, it shall be assumed that array of memory cells 151 is in or of a BRAM, which is reference as BRAM 151.

BRAM 151 is coupled to a supply voltage bus 158 to receive a supply voltage 152. A configuration memory cell ("MC") 157 may be set to control state of a power gating signal 156. In this exemplary embodiment, power gating signal 156 is a negative logic signal, namely power_gate_b signal. However, it should be understood that in other embodiments positive logic signaling may be used.

Power gating signal 156 is provided to a gate of transistor 154. In this exemplary embodiment, transistor 154 is an NMOS transistor. However, it should be understood that in other embodiments, a PMOS transistor may be used. A source node of transistor 154 is coupled to ground or ground bus 155. It should be understood that ground bus 155 represents a signal ground bus or node, which may be directly coupled to an earth ground or a chassis ground for example. A drain node of transistor 154 is coupled to a virtual ground node 153 of BRAM 151.

When power gating signal 156 is logic high, transistor 154 is in a substantially conductive state ("ON"). In such a state, BRAM 151 is in a normal operating or active mode. When power gating signal 156 is logical low, transistor 154 is in a substantially nonconductive state ("OFF"). In such a state, BRAM 151 is in a sleep mode. When in a sleep mode, BRAM current is limited by the leakage current of transistor 154. This leakage current is much lower than corresponding leakage current during an active mode. Thus, there is a power savings by placing memory device 150 in a sleep mode.

However, due to the relatively high resistance of transistor 154 when OFF, voltage and virtual ground node 153 may float up or otherwise rise to a voltage level, which is near that of supply voltage 152. This effectively destroys or erases content or data stored in BRAM 151. This limits the usefulness of memory device 150 in applications where stored data may be needed after coming out of a sleep mode. Furthermore, it may take a relatively long time, such as on the order of 100 or more nanoseconds ("ns") for example, to bring BRAM 151 out of the sleep mode. Thus, such a sleep mode may not be suitable for applications having relatively short periods of inactivity.

As described below in additional detail, embodiments of memory devices having modes that reduce power consumption while retaining content or data are described. Furthermore, such embodiments of memory devices have modes that are suitable for applications with relatively short periods of inactivity. It should, however, be understood that there may be power penalties in the form of spikes in current dissipation associated with entering and/or exiting a sleep mode. Accordingly, the number of cycles memory is idle affects the relative breakeven point of power conservation. However, for sleep times in excess of approximately 5 ns, a power savings may be obtained using a dynamic sleep mode, as described below in additional detail. Use of such a dynamic sleep mode may outweigh penalties associated with entering and exiting such dynamic sleep mode.

Figure 2:
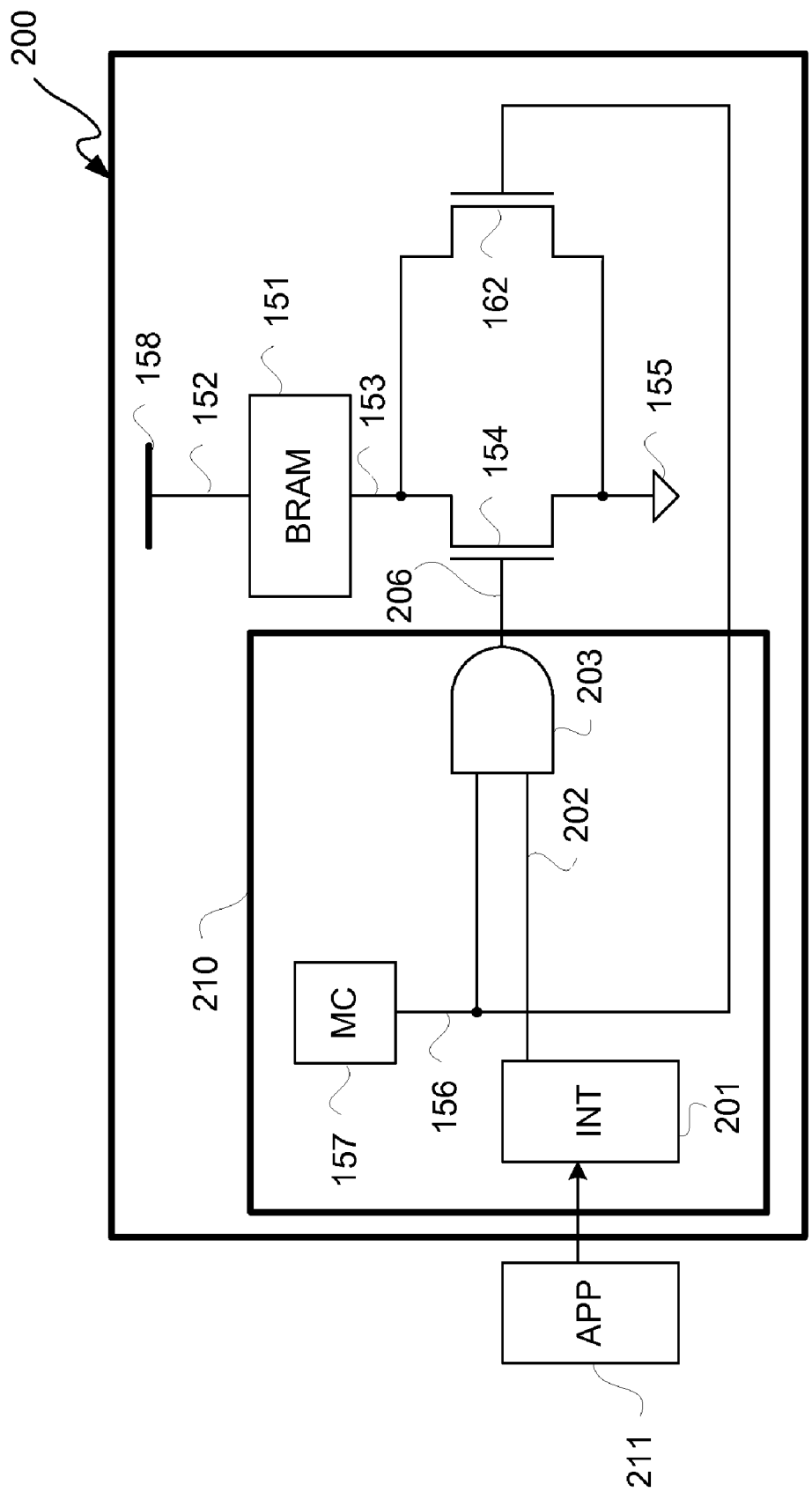
FIG. 2 is a block/circuit diagram depicting an exemplary embodiment of a memory device.

FIG. 2 is a block/circuit diagram depicting an exemplary embodiment of a memory device 200. Memory device 200 includes BRAM 151, transistor 154, ground bus 155, and supply voltage bus 158, as previously described with reference to FIG. 1. Accordingly, such description of those components is not repeated for purposes of clarity.

Memory device 200 further includes a transistor 162 and a control circuit 210. Again, in this exemplary embodiment, transistor 162 is illustratively depicted as an NMOS transistor; however, it should be understood that in other embodiments, a PMOS transistor may be used. Transistor 162 has a source node coupled to ground bus 155 and a drain node coupled to virtual ground node 153. Transistors 154 and 162 are coupled in source-drain parallel to one another between virtual ground node 153 and ground bus 155. Transistor 154 is substantially larger than transistor 162. For example, transistor 154 may be approximately 200 to 1000 times larger than transistor 162. However, other ranges of sizes of transistor 154 may be used in comparison with transistor 162, as may vary depending on RAM size (i.e., number of memory cells), RAM array dimensions, and/or semiconductor process technology node (i.e., which sub 100 nm process is used). Generally, the term "substantially larger" is used herein to mean "at least 10 times larger."

Control circuit 210 includes configuration memory cell 157, interface or interconnect 201, and a logic circuit 203. Control circuit 210 may be used on multiple instances of BRAM 151 and transistors 154 and 162, though a single instance is shown for purposes of clarity. Interconnect 201 in an embodiment may be a user programmable interconnect.

In this exemplary embodiment, a logic circuit 203 is illustratively depicted as an AND gate. However, it should be understood that other types of logic circuits may be used in accordance with the following description. Configuration memory cell 157 may be a configuration memory cell associated with an FPGA; however, in one or more other embodiments, configuration memory cell 157 may be associated with some other type of integrated circuit. Thus, it should be understood that configuration memory cell 157 is a particular type of memory cell that may be used to drive signal on a signal line in contrast to a memory cell associated with storing a data state. This is not to say that configuration memory cell 157 cannot be programmed to have a state or to retained data. However, a configuration memory cell, such as configuration memory cell 157, has an output path that is used for directly driving a signal on a signal line, such as for example an input to a logic gate or gating a transistor.

User application 211, which may be instantiated in programmable resources or be a dedicated circuit, may be coupled to interconnect 201. Interconnect 201 may be the programmable interconnect, such as of an FPGA. Accordingly, a control signal 202 may be provided from user application 211 via interface 201 for input to AND gate 203. Another control signal, which is generally indicated as power gating signal 156, may be provided as an output of configuration memory cell 157 for another input to AND gate 203 and for gating transistor 162.

Output of AND gate 203 is provided as a gating signal 206 to a gate of transistor 154. Control or power gating signal 156 is provided as a gating signal to a gate of transistor 162. By controlling ON and OFF states of transistors 154 and 162 with gating signals 206 and 156, respectively, BRAM 151 may be put in any one of three modes. These three modes are an active mode, a first sleep mode, and a second sleep mode. The first sleep mode was previously described with reference to FIG. 1. The second sleep mode is to be contrasted with the first sleep mode in that data or content stored in BRAM 151 is retained and/or that BRAM 151 may be awakened in a substantially shorter period of time. By substantially shorter period of time, it should be understood that BRAM 151 may be awakened from the second sleep mode in approximately 25% to 50% of the time it would take to be awakened from the first sleep mode.

The first sleep mode may be thought of as a relatively static sleep mode, and the second sleep mode may be thought of as a relatively dynamic mode. This is because in the first sleep mode, BRAM 151 is electrically decoupled from ground bus 155. However, in the second sleep mode, BRAM 151 is electrically coupled to ground bus 155 through a sufficiently small resistance provided by transistor 162 to retain data stored in an array of memory cells associated with BRAM 151. By having a relatively weak bias transistor 162 in source-drain parallel with a much stronger bias transistor 154, a relatively low resistance path to ground bus 155 is provided to keep virtual ground node 153 at a voltage level that does not rise too high. In other words, virtual ground voltage level is sufficiently low with transistor 154 turned OFF and transistor 162 turned ON to retain data stored in BRAM 151, provided, however, there is sufficient voltage across BRAM 151. Generally, transistor 162 may have a resistance in a range of approximately 400 to 2K Ohms.

Additionally, the amount of time to wake up an array of memory cells from the second sleep mode is less than that of the first sleep mode. Accordingly, wake-up latency may be reduced by using the second sleep mode. Generally, wake-up latency is time associated with fully discharging voltage at virtual ground node 153. In some embodiments, BRAM 151 may have all wake-up latency of approximately less than 2 ns. Accordingly, software design tools may be configured to identify opportunities where an array of memory cells may be put into the second sleep mode in order to conserve power.

For example, power gating signal 156 controls state of transistor 162. A user sleep control signal 202 may come from a programmable interconnect 201 to activate dynamic switching of transistor 154. Accordingly, for an active mode, power gating signal 156 and sleep control signal 202 are both logic high, and thus both transistors 154 and 162 are in an ON state. However, it should be understood that because transistor 154 substantially larger than transistor 162, transistor 154 dominates this electrical coupling of virtual ground node 153 to ground bus 155. For a first sleep mode, power gating signal 156 is logic low, and thus both transistors 154 and 162 are in an OFF state. It should be understood that a default state may be to program configuration memory cell 157 to provide power gating signal 156 with a logic high state to allow for an active mode to be subsequently used. However, by setting configuration memory cell 157 to a logic low level, an active mode would not be available for BRAM 151 unless configuration memory cell 157 was reprogrammed to provide a logic high state output.

For a second sleep mode, namely sleep mode with data retention, power gating signal 156 is logic high and sleep control signal 202 is logical low, and thus transistor 154 is in an OFF state and transistor 162 is in an ON state. Accordingly, for the second sleep mode, configuration memory cell 157 is programmed to output a logic high state for power gating signal 156, and a user may dynamically switch between the second sleep mode and an active mode by toggling sleep control signal 202. In the second sleep mode, sleep control signal 202 is at a logic low state. It should be understood that the first sleep mode is mutually exclusive with the second sleep mode in the exemplary embodiment of memory device 200. Thus, even though transistor 154 is in an OFF state during the second sleep mode, memory device 200 is not in the first sleep mode.

The relative amount of power reduction may depend in part on voltage at virtual ground node 153 during a sleep mode. Moreover, the amount of voltage at virtual ground node 153 may depend in part on the amount of leakage current of BRAM 151. Generally, a leaky die from a "fast corner" of a semiconductor process may result in a greater power reduction than a low leakage die from a "slow corner" of such semiconductor process. Thus, to generally provide power reduction across process corners, multiple bias transistors may be implemented in a memory device, as described in additional detail with reference to FIG. 3.

Figure 3:
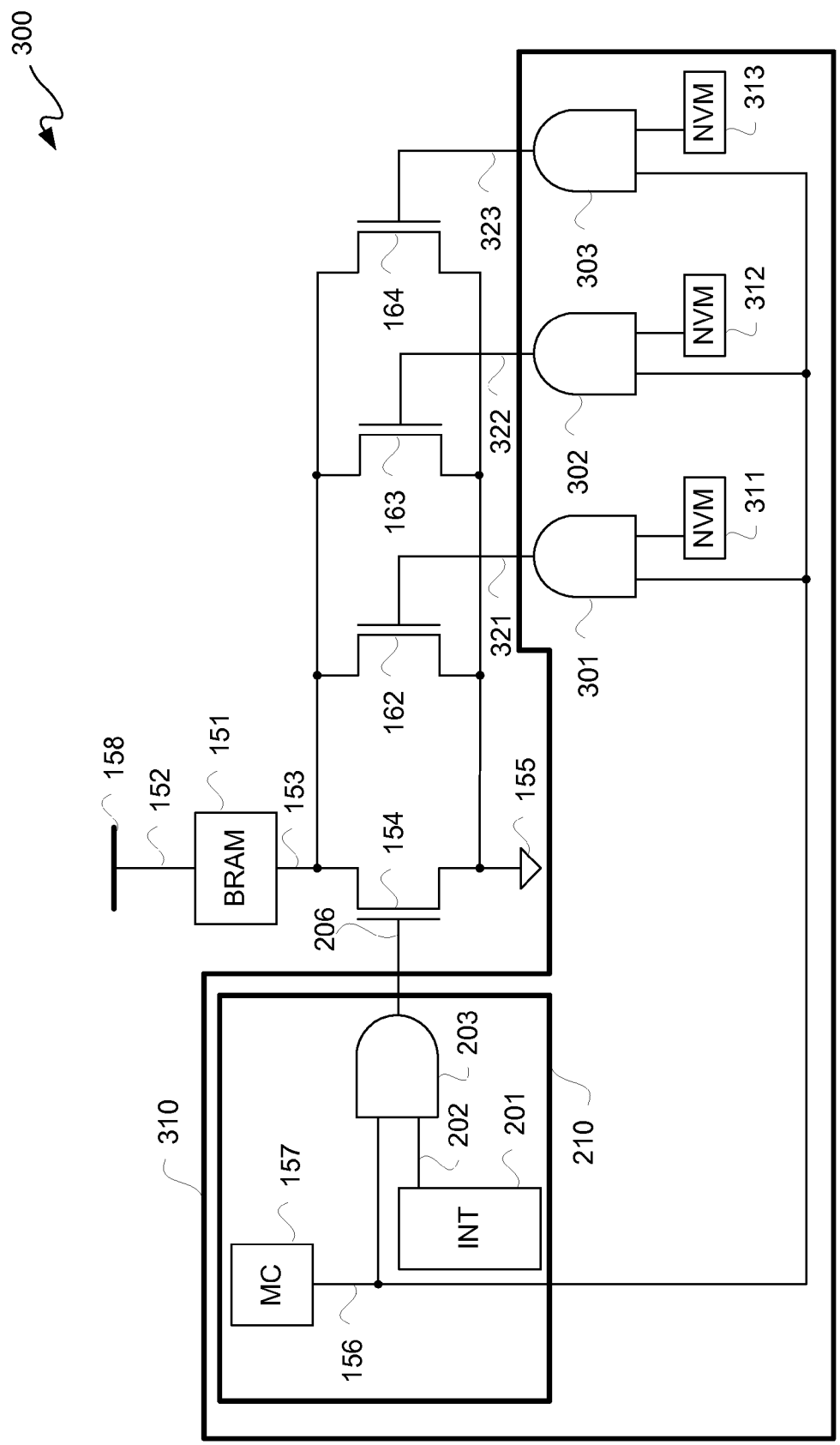
FIG. 3 is a block/circuit diagram depicting an exemplary embodiment of a memory device having multiple bias transistors.

FIG. 3 is a block/circuit diagram depicting an exemplary embodiment of a memory device 300 having multiple bias transistors, namely bias transistors 162 through 164. Memory device 300 builds upon memory device 200 of FIG. 2, and thus, generally only the differences are described for purposes of clarity.

Control circuit 310 of memory device 300 includes control circuit 210, control logic 301 through 303, and in nonvolatile memory cells, 311 through 313. In this exemplary embodiment, control logic 301 through 303 is illustratively depicted as AND gates 301 through 303, respectively. However, it should be understood that other types of logic may be used.

Power gating signal 156 is provided as a control signal input to each of AND gates 301 through 303. Nonvolatile memory cells 311 through 313 are respectively coupled to AND gates 301 through 303 for input to such AND gates. Output of AND gate 301 is provided as a gating signal 321 to a gate of transistor 162. Output of AND gate 302 is provided as a gating signal 322 to a gate of transistor 163. Output of AND gate 303, is provided as a gating signal 323 to a gate of transistor 164. Even though three bias transistors 162 through 164 are illustratively depicted, it should be appreciated that fewer or more than three biased transistors may be used.

Bias transistors 162 through 164 are all coupled in source-drain parallel with one another and with transistor 154. Thus, each of transistors 162 through 164 may be used to electrically couple, or electrically decouple, ground bus 155 to, or from, virtual ground node 153 from source-to-drain via respective channels.

Nonvolatile memory cells 311 through 313 may be any type of nonvolatile memory cell, namely a memory cell that retains state when power is removed. Examples of such nonvolatile memory cells include fuses, anti-fuses, EEPROM cells and flash cells, among others. Accordingly, during manufacturing of the semiconductor dice, each die may be generally characterized as a fast or slow corner part.

Fast corner parts may have all nonvolatile memory cells 311 through 313 set such that that their respective outputs are logic high, namely logic 1. Thus, for power gating signal 156 in a logic high state, each of power gating signals 321 through 323 is likewise in a logic high state. Thus, each of bias transistors 162 through 164 is in an ON state.

Slow corner parts may have a subset of nonvolatile memory cells 311 through 313 set such that their respective outputs are logic low, namely logic 0, and have the remainder of such nonvolatile memory cells set such that their respective outputs are logic high. By setting a subset of nonvolatile memory cells 311 through 313 to output a logic low state, a corresponding subset of bias transistors 162 through 164 are disabled, namely always in an OFF state. Disabling a subset of bias transistors 162 through 164 increases effective resistance of the remainder of such bias transistors, namely those of bias transistors 162 through 164 that are not disabled, during a second sleep mode. An increase in effective resistance may be used to cause voltage at virtual ground node 153 to rise to a higher level than if none of transistors 162 through 164 were disabled during such a second sleep mode.

It should be understood that nonvolatile memory cells 311 through 313 are programmed by a manufacturer of semiconductor die. In contrast, configuration memory cell 157 is user programmable. It is been assumed that size of bias transistors 162 through 164 is generally invariant, subject to semiconductor process variation. However, it should be understood that bias transistors 162 through 164 do not have to be manufactured such that they have the same size, as described below in additional detail with reference to FIG. 4.

Figure 4:
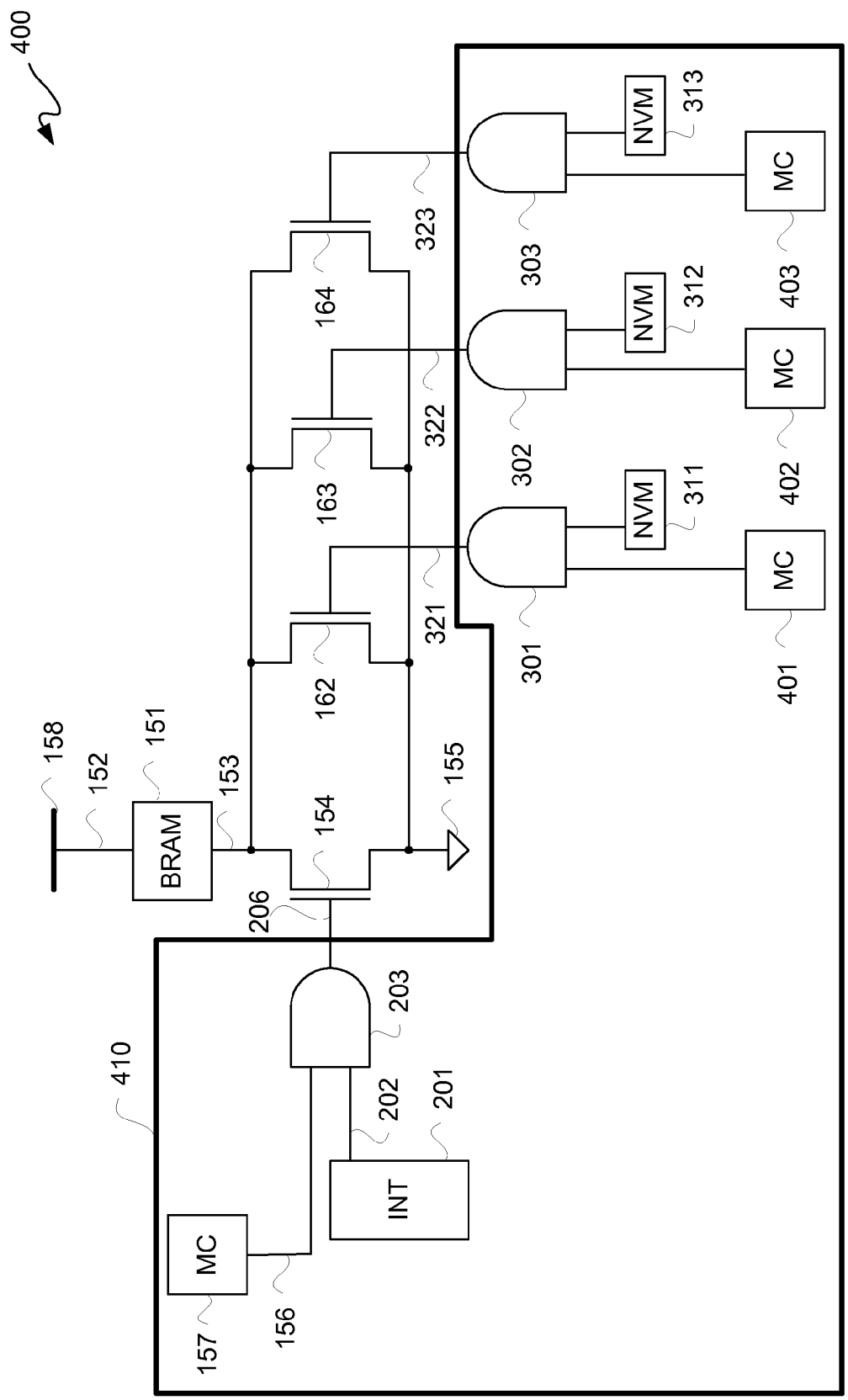
FIG. 4 is a block/circuit diagram depicting an exemplary embodiment of another memory device.

FIG. 4 is a block/circuit diagram depicting an exemplary embodiment of a memory device 400. Memory device 400 is similar to memory device 300 of FIG. 3, and thus, generally only differences are described for purposes of clarity.

Rather than providing power gating signal 156 has input to each of AND gates 301 through 303, AND gates 301 through 303 receives a respective input from configuration memory cells 401 through 403. Again, it should be understood that configuration memory cells 401 through 403 may be user programmed. Accordingly, sizes of bias transistors 162 through 164 may intentionally be varied, and a user may set program configuration memory cells 401 through 403 for an application. Generally, transistor 162 through 164 may have a resistance in a range of approximately 800 to 2K Ohms.

It should be understood that having different bias transistor sizes, and thus different resistances when in ON states, may be useful for providing different sleep mode attributes, such as power savings, breakeven times with respect to power savings and sleep mode duration, and/or wakeup latencies. Thus, a user may determine which one or more of bias transistors 162 through 164 are to be used in their application. Moreover, bias transistors 162 through 164 may be all the same size or may be progressively smaller in size. It should be understood that more complex control logic may be used in other embodiments to further enhance bias transistor sizing to address process variations and/or differing application uses.

It has been assumed that a user has programmed configuration memory cell 157 to provide a logic high output. However, a user may program configuration memory cell 157 to have a logic low output such that BRAM 151 is in the first sleep mode. However, a user may want to have the option of having power gating signal 156 switched dynamically or "on-the-fly" during operation, namely after programming configuration memory cells without having to halt operation to reprogram such configuration memory cells.

Figure 5:
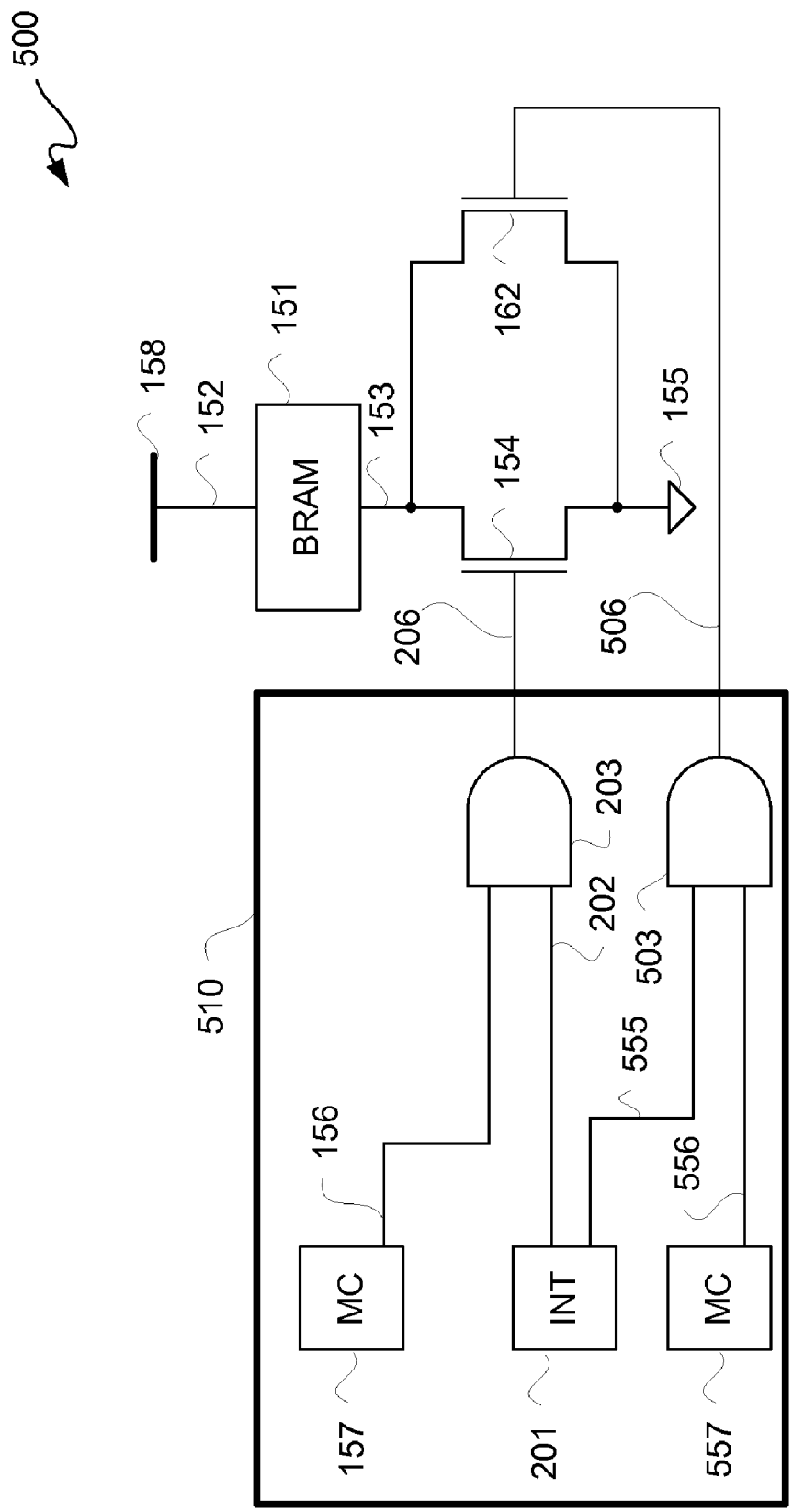
FIG. 5 is a block diagram depicting an exemplary embodiment of yet another memory device.

FIG. 5 is a block diagram depicting an exemplary embodiment of a memory device 500. Memory device 500 is similar to memory device 200 of FIG. 2, and thus, generally only the differences are described for purposes of clarity.

Added to control circuit 210 of FIG. 2 is a configuration memory cell 557 and an AND gate 503 to provide control circuit 510 of FIG. 5. In another embodiment, configuration memory cells 157 and 557 may be replaced with non-volatile memory cells. A sleep control signal 555 and a power gating signal 556 are respectively sourced from interconnect 201 and configuration memory cell 557. Power gating signal 156 and sleep control signal 202 are provided as inputs to AND gate 203. Power gating signal 556 and sleep control signal 555 are provided as inputs to AND gate 503. It is assumed that a default state of configuration memory cells, such as configuration memory cells 157 and 557, is logic low. However, in other embodiments, a default state of configuration memory cells may be logic high, in which embodiment, OR gates may replace the AND gates, and a user may set configuration memory cells to output a logic low to invoke sleep mode capability. Accordingly, in this embodiment, if a user wants to have the ability to toggle a first sleep mode on and off, then configuration memory cell 157 is programmed to output logic high for power gating signal 156. Furthermore, in this embodiment, if a user wants to have the ability to toggle a second sleep mode on and off, then configuration memory cell 557 is programmed to output logic high for power gating signal 556. Output of AND gate 203 provides gating signal 206 for gating transistor 154, and output of AND gate 503 provides gating signal 506 for gating transistor 162.

Assume that both configuration memory cells 157 and 557 are set to output logic highs. If a user decides to invoke a second sleep mode, sleep control signal 555 is asserted, namely logic high, and thus gating signal 506 is logic high. Additionally, gating signal 206 is logic low, responsive to sleep control signal 202 not being asserted, namely logic low. For a first sleep mode, sleep control signal 202 and sleep control signal 555 are both logic low. Thus, responsive to sleep control signals 202 and 555, a user or application may dynamically select between a first sleep mode and a second sleep mode. A user may switch on-the-fly between the first and second sleep modes without having to reconfigure configuration memory cells, for example configuration memory cells 157 and 557. In this embodiment, at least sleep control signal 202, and optionally both of sleep control signals 202 and 555, may be asserted for an active mode.

Figure 6:
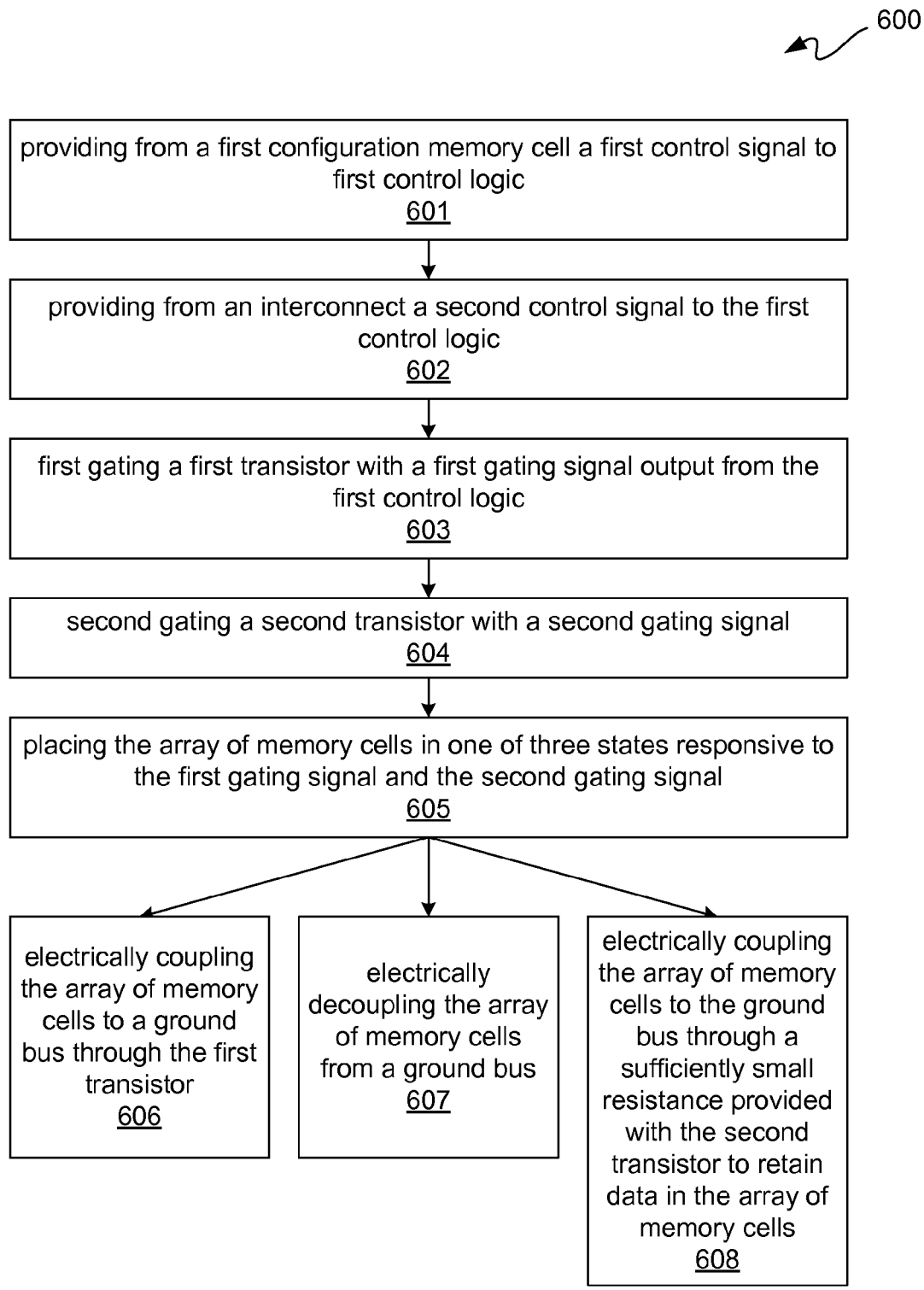
FIG. 6 is a flow diagram depicting an exemplary embodiment of a process for an array of memory cells.

FIG. 6 is a flow diagram depicting an exemplary embodiment of a process 600 for an array of memory cells. At 601, a first configuration memory cell provides a first control signal to first control logic. This was previously described with reference to output of configuration memory cell 157 provided to AND gate 203 in one or more exemplary embodiments. At 602, the second control signal is provided from an interconnect to the first control logic. This was previously described with reference to control signal 202 provided from interconnect 201 to AND gate 203 in one or more exemplary embodiments.

At 603, a first transistor is gated with a first gating signal output from the first control logic. This was previously described with reference to transistor 154 being gated with gating signal 206 output from AND gate 203 in one or more exemplary embodiments. At 604, a second transistor is gated with a second gating signal. This was previously described with reference to, for example, transistor 162 being gated with either gating signal 156 or 321 in one or more exemplary embodiments.

At 605, the array of memory cells is placed in one of three states or modes responsive to the first and second gating signals. This was previously described with reference to an active mode, a first sleep mode, and a second sleep mode.

If the array of memory cells is placed in an active mode at 605, then at 606 the array of memory cells is electrically coupled to a ground bus through the first transistor. It should be understood that both the first transistor and the second transistor may be in an ON state during an active mode; however, the first transistor is substantially larger than the second transistor and thus dominates this electrical coupling.

If the array of memory cells is placed in a first sleep mode at 605, then at 607 the array of memory cells is electrically decoupled from the ground bus. It should be understood that both the first transistor and the second transistor may be in an OFF state during the first sleep mode.

If the array of memory cells is placed in a second sleep mode at 605, then at 608 the array of memory cells is electrically coupled to the ground bus through a sufficiently small resistance provided with the second transistor. In the second sleep mode data stored in the array of memory cells is retained.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic is typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

Figure 7:
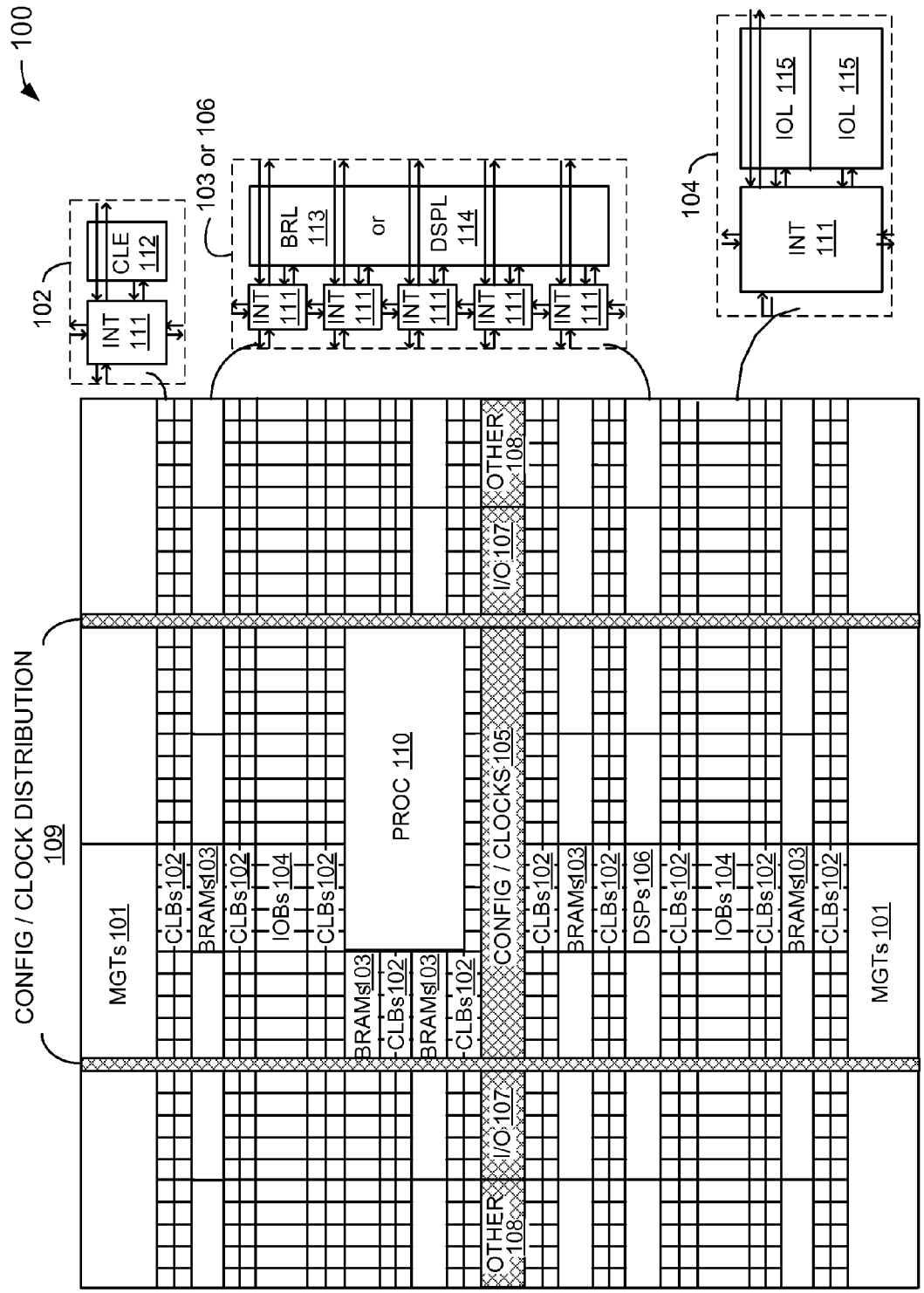
FIG. 7 is a simplified block diagram depicting an exemplary embodiment of a columnar Field Programmable Gate Array ("FPGA") architecture in which one or more aspects of the invention may be implemented.

As noted above, advanced FPGAs can include several different types of programmable logic blocks in the array. For example, FIG. 7 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element in each adjacent tile. Therefore, the programmable interconnect elements taken together implement the programmable interconnect structure for the illustrated FPGA. The programmable interconnect element 111 also includes the connections to and from the programmable logic element within the same tile, as shown by the examples included at the top of FIG. 7.

For example, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the I/O logic element 115.

In the pictured embodiment, a horizontal area near the center of the die (shown in FIG. 7) is used for configuration, clock, and other control logic. Vertical columns 109 extending from this horizontal area or column are used to distribute the clocks and configuration signals across the breadth of the FPGA.

Some FPGAs utilizing the architecture illustrated in FIG. 7 include additional logic blocks that disrupt the regular columnar structure making up a large part of the FPGA. The additional logic blocks can be programmable blocks and/or dedicated logic. For example, processor block 110 spans several columns of CLBs and BRAMs.

Note that FIG. 7 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 7 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

While the foregoing describes exemplary embodiments in accordance with one or more aspects of the invention, other and further embodiments in accordance with the one or more aspects of the invention may be devised without departing from the scope thereof, which is determined by the claims that follow and equivalents thereof. Trademarks are the property of their respective owners.

What is claimed is:
1. A memory device, comprising:
an array of memory cells coupled between a virtual ground node and a supply node;
a first transistor and a second transistor coupled in source-drain parallel to one another between the virtual ground node and a ground bus;
wherein the first transistor is substantially larger than the second transistor;
a control circuit coupled to provide a first gate signal to a gate of the first transistor and further coupled to provide a second gate signal to a gate of the second transistor;

wherein the control circuit includes:
- a first configuration memory cell coupled to provide a first control signal;
- an interconnect coupled to provide a second control signal; and
- first control logic coupled to receive the first control signal and the second control signal, and further coupled to provide the first gate signal; and wherein the array of memory cells has three modes responsive to the first gate signal and the second gate signal, the three modes including an active mode, a first sleep mode, and a second sleep mode.

2. The memory device according to claim 1, wherein:
the first sleep mode electrically decouples the array of memory cells from the ground bus; and
the second sleep mode electrically couples the array of memory cells to the ground bus through a resistance provided with the second transistor, the resistance being small enough to retain data stored in the array of memory cells.

3. The memory device according to claim 2, wherein the control circuit further includes:
- a second configuration memory cell coupled to provide a third control signal; and
- a multiplexer coupled to receive the first control signal and the third control signal, and further coupled to select the second gate signal responsive to a fourth control signal provided from the interconnect.

4. The memory device according to claim 3, wherein:
the first configuration memory cell and the second configuration memory cell are user programmable cells; and
the first configuration memory cell and the second configuration memory cell have outputs for directly driving logic signal states.

5. The memory device according to claim 1, wherein:
the array of memory cells comprises a block random access memory; and
the interconnect comprises a user programmable interconnect.

6. The memory device according to claim 1, wherein the array of memory cells comprises an array of static random access memory cells.

7. The memory device according to claim 1, wherein an output of the first configuration memory cell is directly coupled to the gate of the second transistor, wherein the first control signal and the second gate signal are the same signal.

8. The memory device according to claim 1, wherein the control circuit further includes:
- a first non-volatile memory cell coupled to provide a third control signal; and
- second control logic coupled to receive the third control signal and the first control signal and further coupled to provide the second gate signal.

9. The memory device according to claim 8, further comprising:
- a third transistor coupled in source-drain parallel with the first transistor and the second transistor between the virtual ground node and a ground bus;
- wherein the first transistor is substantially larger than each of the second transistor and the third transistor;
- wherein the control circuit is coupled to provide a third gate signal to a gate of the third transistor; and wherein the control circuit further includes:
- a second non-volatile memory cell coupled to provide a fourth control signal; and
- third control logic coupled to receive the fourth control signal and the first control signal, and further coupled to provide the third gate signal.

10. The memory device according to claim 9, wherein:
the second transistor and the third transistor are a same size; and
each of the first control logic, the second control logic, and the third control logic comprises a respective AND gate.

11. A memory device, comprising:
an array of memory cells coupled between a virtual ground node and a supply node;
a first transistor and a second transistor coupled in source-drain parallel to one another between the virtual ground node and a ground bus;
wherein the first transistor is substantially larger than the second transistor;
a control circuit coupled to provide a first gate signal to a gate of the first transistor, and further coupled to provide a second gate signal to a gate of the second transistor;
wherein the control circuit includes:
- a first configuration memory cell coupled to provide a first control signal;
- an interconnect coupled to provide a second control signal;
- first control logic coupled to receive the first control signal and the second control signal, and further coupled to provide the first gate signal;
- a second configuration memory cell coupled to provide a third control signal;
- a first non-volatile memory cell coupled to provide a fourth control signal; and
- second control logic coupled to receive the third control signal and the fourth control signal to provide the second gate signal; and wherein the array of memory cells has three modes responsive to the first gate signal and the second gate signal, the three modes including an active mode, a first sleep mode, and a second sleep mode.

12. The memory device according to claim 11, wherein:
the first sleep mode electrically decouples the array of memory cells from the ground bus; and
the second sleep mode electrically couples the array of memory cells to the ground bus through a resistance provided with the second transistor, the resistance being small enough to retain data stored in the array of memory cells.

13. The memory device according to claim 11, further comprising:
- a third transistor coupled in source-drain parallel with the first transistor and the second transistor between the virtual ground node and a ground bus;
- wherein the first transistor is substantially larger than each of the second transistor and the third transistor;
- wherein the control circuit is coupled to provide a third gate signal to a gate of the third transistor; and
- wherein the control circuit further includes:
  - a third configuration memory cell coupled to provide a fifth control signal;
  - a second non-volatile memory cell coupled to provide a sixth control signal; and
  - third control logic coupled to receive the fifth control signal and the sixth control signal, and further coupled to provide the third gate signal.

14. The memory device according to claim 13, wherein:
the third transistor is smaller than the second transistor; and
each of the first control logic, the second control logic, and the third control logic comprises a respective AND gate.

15. The memory device according to claim 11, wherein the array of memory cells comprises an array of static random access memory cells.

16. The memory device according to claim 11, wherein:
the interconnect comprises a user programmable interconnect; and
the array of memory cells comprises a block random access memory.

17. An integrated circuit, comprising:
an array of memory cells;
a first transistor and a second transistor coupled in source-drain parallel to one another between the array of memory cells and a ground;
wherein the first transistor is substantially larger than the second transistor; and
a control circuit having a first output coupled to a gate of the first transistor and a second output coupled to a gate of the second transistor;
wherein the control circuit includes:
a configuration memory cell having an output;
wherein the output of the configuration memory cell is coupled to the gate of the second transistor;
an interconnect having an output; and
control logic having a first input coupled to the output of the configuration memory cell, a second input coupled to the output of the interconnect, and an output coupled to the first output of the control circuit.

18. The integrated circuit according to claim 17, wherein the array of memory cells has three modes responsive to signals on the first and second outputs of the control circuit, the three modes including an active mode, a first sleep mode, and a second sleep mode.

19. The integrated circuit according to claim 18, wherein:
the first sleep mode electrically decouples the array of memory cells from the ground; and
the second sleep mode electrically couples the array of memory cells to the ground bus through a resistance provided with the second transistor, the resistance being small enough to retain data stored in the array of memory cells.

20. The integrated circuit according to claim 17, wherein the control logic comprises an AND gate.

* * * * *